US008951049B2

(12) United States Patent
Chang et al.

(10) Patent No.: US 8,951,049 B2
(45) Date of Patent: Feb. 10, 2015

(54) ELECTRICAL CONNECTOR ASSEMBLY WITH AN ADAPTOR FOR ELECTRICAL CONNECTING THE ELECTRICAL CONNECTOR AND THE PCB

(71) Applicant: Hon Hai Precision Industry Co., Ltd., New Taipei (TW)

(72) Inventors: Yen-Chih Chang, New Taipei (TW); Tzu-Yao Hwang, New Taipei (TW); Ke-Hao Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 92 days.

(21) Appl. No.: 13/886,278

(22) Filed: May 3, 2013

(65) Prior Publication Data

US 2013/0330945 A1    Dec. 12, 2013

(30) Foreign Application Priority Data

Jun. 7, 2012   (TW) .............................. 101120512 A

(51) Int. Cl.
*H01R 12/00*   (2006.01)
*H01R 12/77*   (2011.01)
*H05K 7/10*    (2006.01)

(52) U.S. Cl.
CPC ................ *H01R 12/777* (2013.01); *H05K 7/10* (2013.01)
USPC ........................................... 439/66; 439/108

(58) Field of Classification Search
CPC ... H01R 23/722; H01R 23/725; H01R 23/688
USPC ....................................... 439/66, 71, 74, 108
See application file for complete search history.

(56) References Cited

U.S. PATENT DOCUMENTS

| | | | |
|---|---|---|---|
| 5,051,099 A * | 9/1991 | Pickles et al. ................. | 439/108 |
| 5,174,763 A * | 12/1992 | Wilson ........................... | 439/66 |
| 6,846,184 B2 | 1/2005 | Fan et al. | |
| 7,025,601 B2 * | 4/2006 | Dittmann ....................... | 439/66 |
| 7,114,961 B2 * | 10/2006 | Williams ........................ | 439/66 |
| 7,758,351 B2 * | 7/2010 | Brown et al. .................. | 439/66 |
| 7,773,388 B2 * | 8/2010 | Kariya et al. ................. | 361/776 |
| 8,066,517 B2 * | 11/2011 | Russell .......................... | 439/66 |

* cited by examiner

*Primary Examiner* — Thanh Tam Le
(74) *Attorney, Agent, or Firm* — Wei Te Chung; Ming Chieh Chang

(57) ABSTRACT

An electrical connector assembly includes a printed circuit board, an electrical connector assembled on the printed circuit board and an interposer assembled between the electrical connector and the printed circuit board, the electrical connector includes an insulative housing and a plurality of terminals and a shielding element received therein, and wherein the interposer electrically connect the terminals and the shielding element and electrically connect the printed circuit board.

9 Claims, 6 Drawing Sheets

US 8,951,049 B2

ELECTRICAL CONNECTOR ASSEMBLY WITH AN ADAPTOR FOR ELECTRICAL CONNECTING THE ELECTRICAL CONNECTOR AND THE PCB

1. FIELD OF THE INVENTION

The present invention relates to an electrical connector assembly, and more particularly to an electrical connector assembly has an adaptor between the electrical connector and the printed circuit board to get better shielding effect and electrically connecting the electrical connector to the printed circuit board.

2. DESCRIPTION OF THE PRIOR ART

As the recent technology show, a number of electrical connectors have to set a grounding device due to high transmitting speed and high frequency. The transmitting speed becomes faster and faster, the influence of the interference becomes larger and larger. The electrical connector not only includes signal contacts, but also includes grounding contacts assembled around the signal contacts, so as to prevent the interference produced by the signal contact.

Due to a shielding device of the electrical connector, it need a whole grounding net to get better shielding effect, because of the difference of the cost between a chip module and a printed circuit board, and the technology of the chip module and the printed circuit board is not similar, so, the chip module has a grounding layer matched with the shielding device and the printed circuit board can not matched with the shielding device directly.

Therefore, it is needed to find a new electrical socket to overcome the problems mentioned above.

SUMMARY OF THE INVENTION

Accordingly, an object of the present invention is to provide an electrical connector assembly to get better shielding effect.

In order to achieve the object set forth, an electrical connector assembly includes a printed circuit board, an electrical connector assembled on the printed circuit board and an interposer assembled between the electrical connector and the printed circuit board; the electrical connector includes an insulative housing and a plurality of terminals and a shielding element received therein; and wherein the interposer electrically connect the terminals and the shielding element and electrically connect the printed circuit board.

DESCRIPTION OF PREFERRED EMBODIMENT

Figure 1:
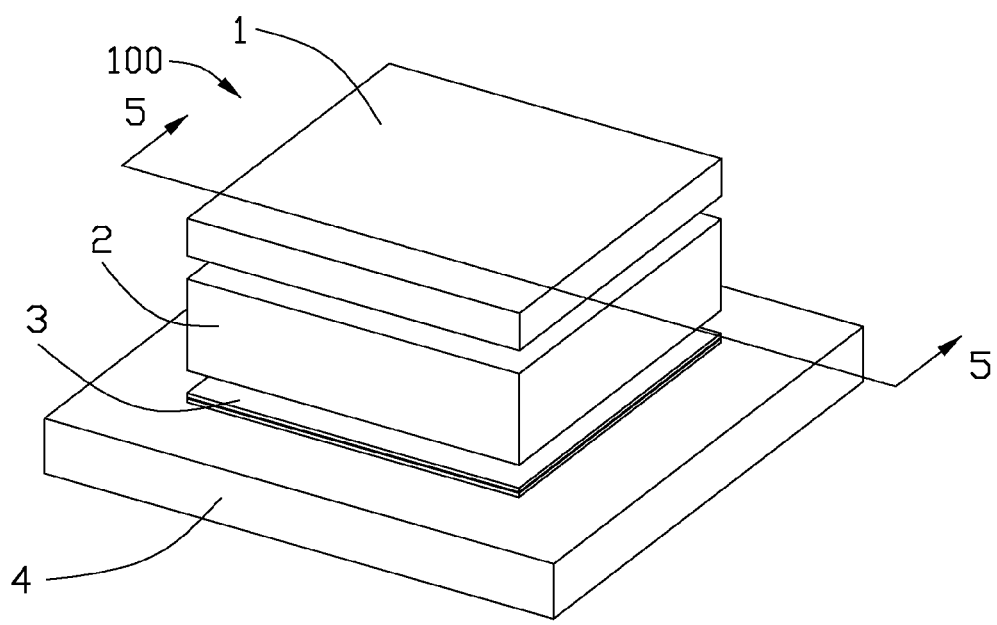
FIG. 1 is assembled view of an electrical connector in accordance with a preferred embodiment of the present invention.
Figure 2:
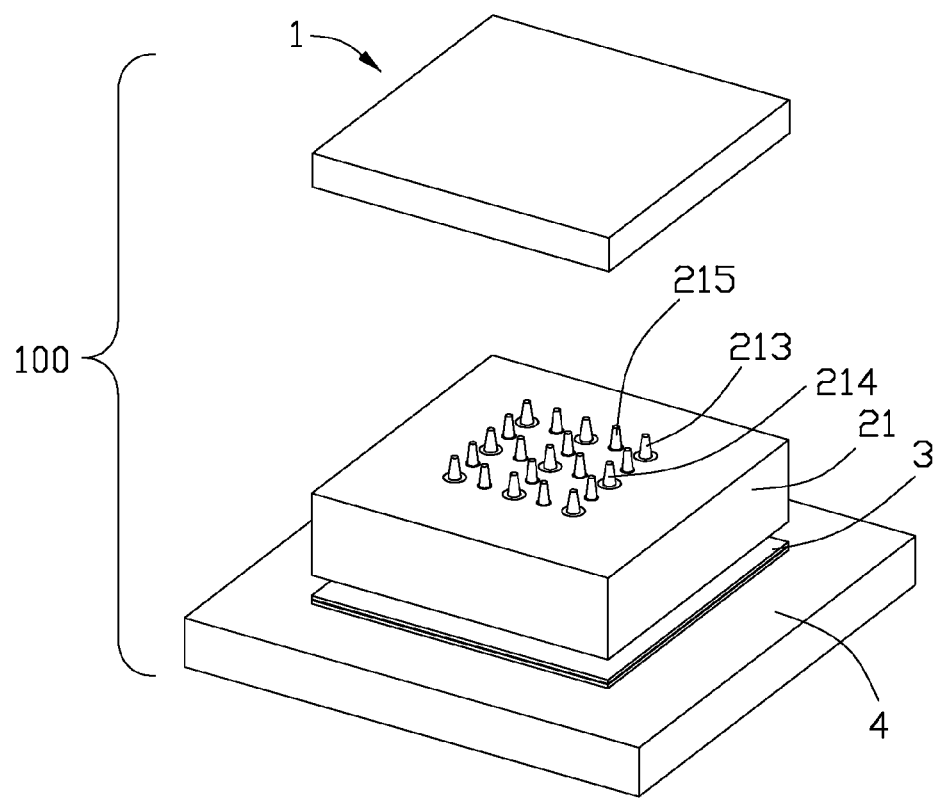
FIG. 2 is partially exploded view of the electrical connector as shown in FIG. 1.

Reference will now be made to the drawings to describe the present invention in detail.

Referring to FIGS. 1-6, an electrical connector assembly 100 according to the present invention comprises a printed circuit board 4 (PCB), an adaptor 3 mounted on the printed circuit board and an electrical connector 2 electrically connecting a chip module 1 and the PCB 4. The adaptor 3 disposed between the PCB 4 and the electrical connector 2 and electrically connecting therethem. The printed circuit board 4 comprises a plurality of bottom pads and a grounding layer (not show). The electrical connector 2 comprises an insulative housing 20, a plurality of terminals 21 and a shielding element (not labeled) received therein. The shielding element in accordance with a preferred embodiment of the present invention is a plurality of shielding terminals 215. The material of the adaptor 3 is similar to the material of the printed circuit board 4.

Figure 5:
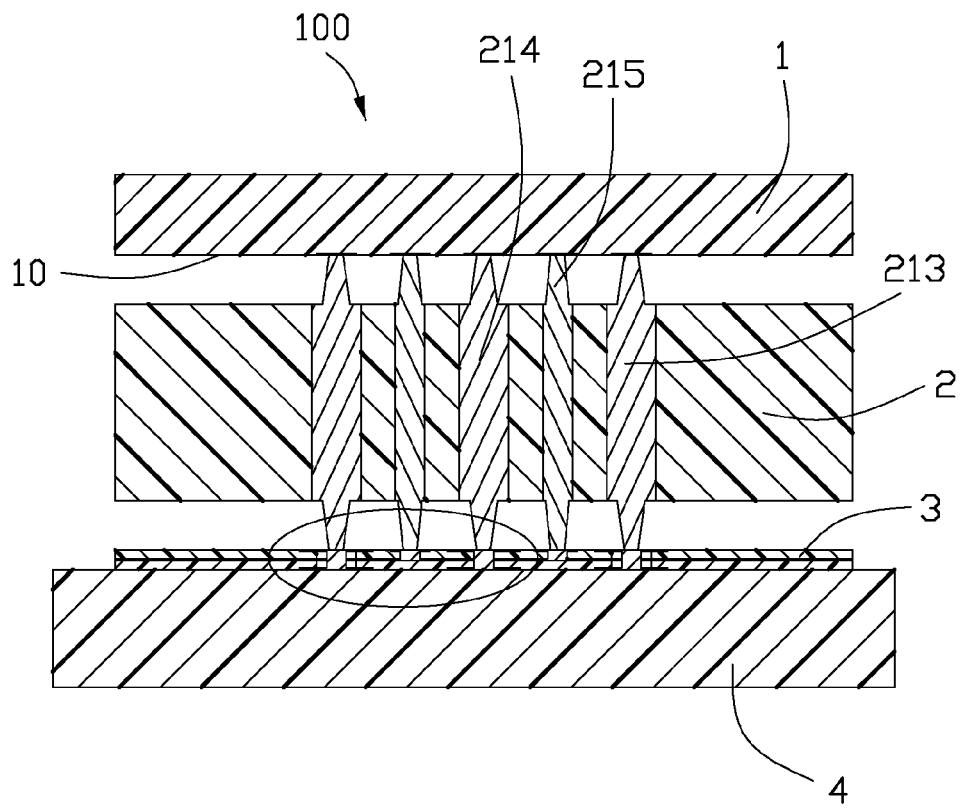
FIG. 5 is a cross-sectional view of the electrical connector taken along line 5-5 in FIG. 1.

Referring to FIG. 5, the chip module 1 has a bottom 10, the bottom 10 has a plurality of top pads and a plurality of shielding elements (not show) located around the top pad and electrically connecting the terminals 21 and the shielding terminals 215 of the electrical connector 2 respectively.

Figure 3:
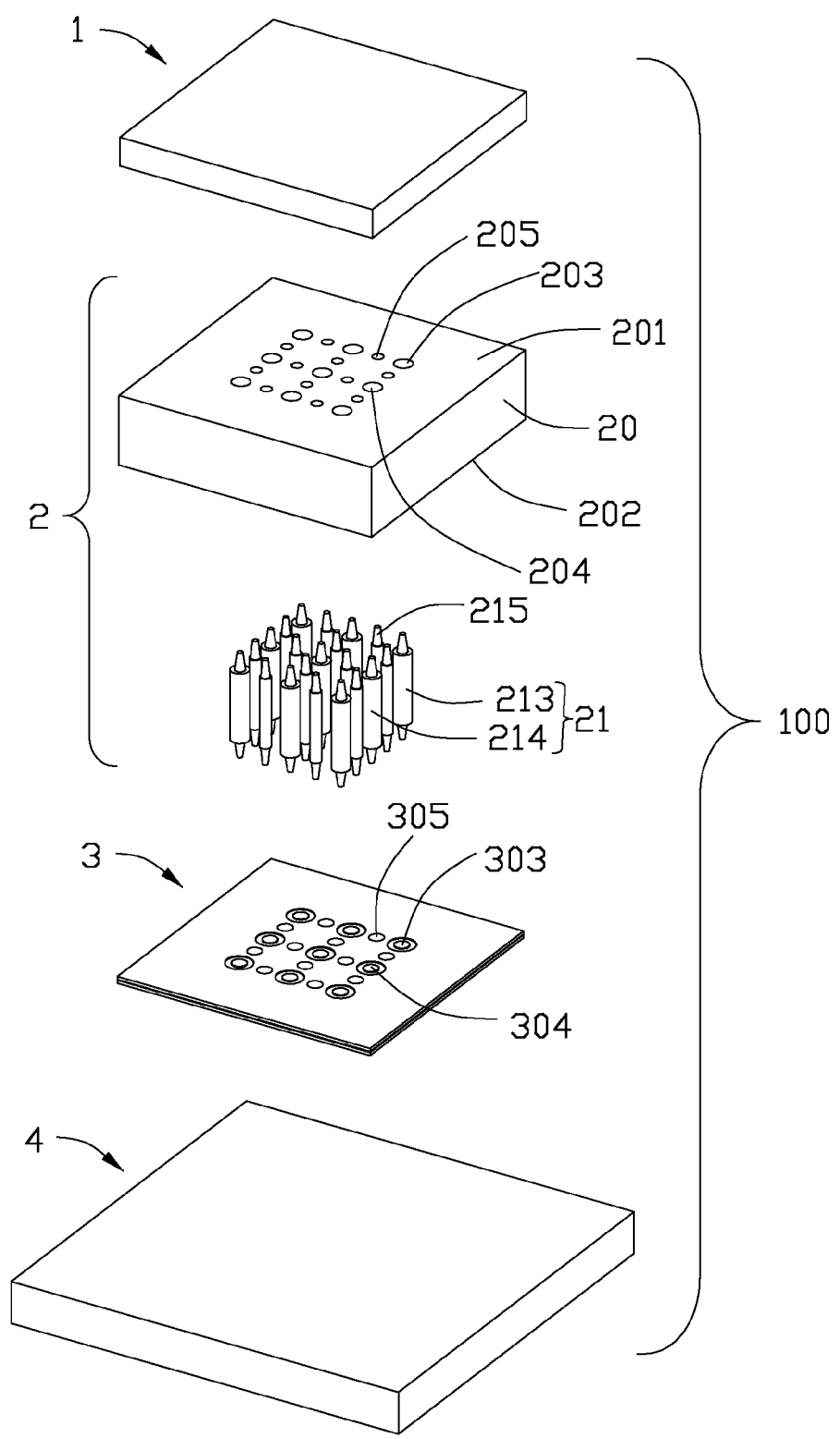
FIG. 3 is an exploded view of the electrical connector as shown in FIG. 1.

Referring to FIG. 3, the insulative housing 20 comprises a matching surface 201, a mounting surface 202 opposite to the matching surface 201 and a plurality of first receiving holes 203, a plurality of second receiving holes 205 and a plurality of third receiving holes 204 penetrated from the matching surface 201 to the mounting surface 202 respectively. The first receiving holes 203 and the third receiving holes 204 are arranged in a matrix, and the first receiving hole 203 and the third receiving hole 204 are surrounded by the second receiving holes 205. The diameter of the first receiving hole 203 is equal to the diameter of the third receiving hole 204, the diameter of the first receiving hole 203 and the third receiving hole 204 is larger than the diameter of the second receiving holes 205 respectively.

Each of the terminals 21 comprises a plurality of contacting terminals 213 and a plurality of grounding terminals 214. The contacting terminals 213 and the grounding terminals 214 are arranged in a matrix and the contacting terminal 213 and the grounding terminal 214 are surrounded by the shielding terminals 215. The contacting terminal 213 is received in the first receiving hole 203, the grounding terminal 214 is received in the third receiving hole 204 and the shielding terminal 215 is received in the second receiving hole 205.

Figure 4:
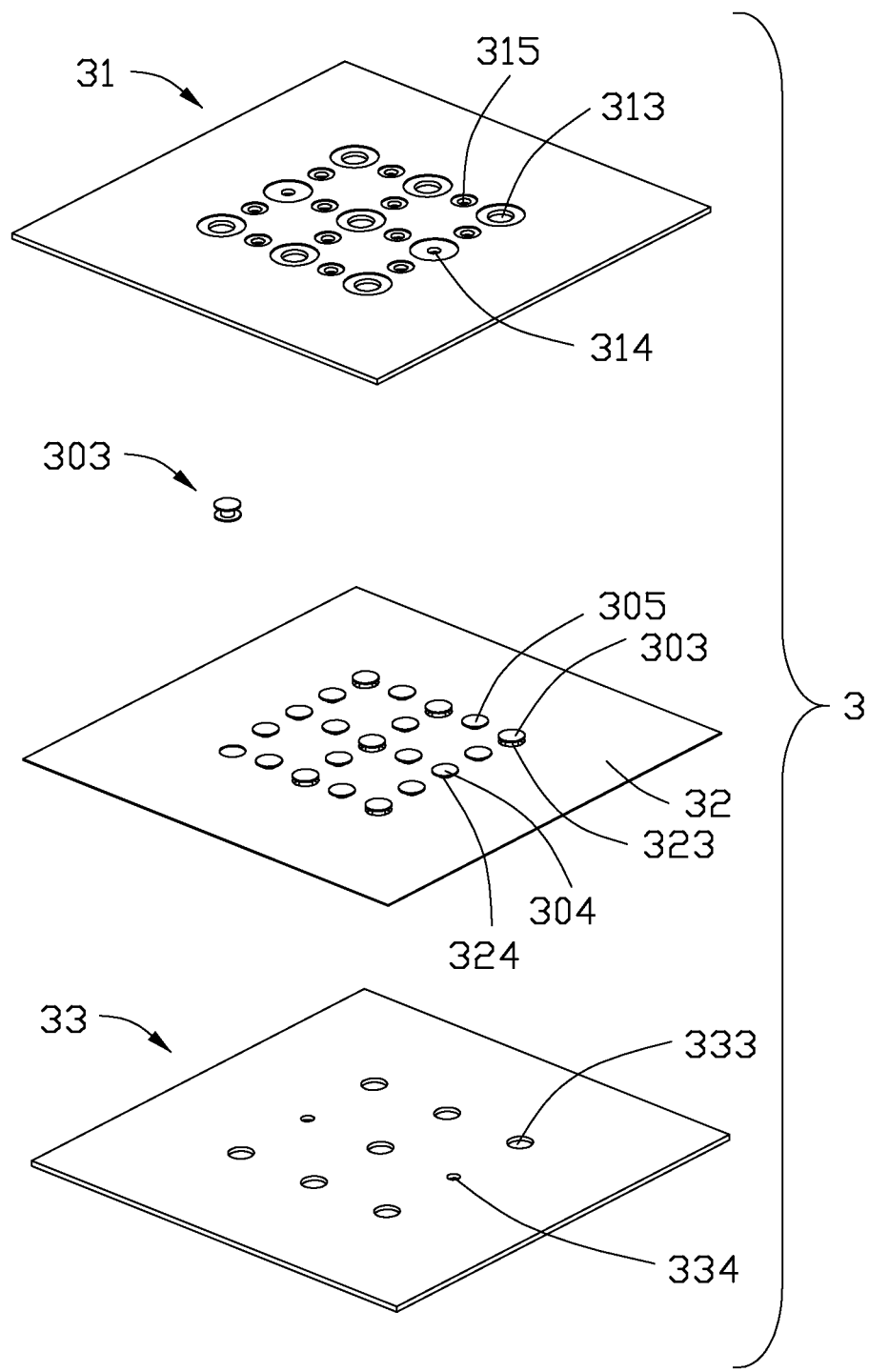
FIG. 4 is an exploded view of the adaptor as shown in FIG. 3.

Referring to FIGS. 3-4, the adaptor 3 is configured with rectangle shape and assembled between the electrical connector 2 and the printed circuit board 4. The adaptor 3 comprises a top insulative board 31 faced the mounting surface 202 of the electrical connector 2, a bottom insulative board 33 mounted onto the printed circuit board 4 and a shielding layer 32 located between the top insulative board 31 and the bottom insulative board 33. The top insulative board 31 has a plurality of first holes 313, a plurality of second holes 314 and a plurality of third holes 315, the diameter of the first hole 313 is larger than the diameter of the second hole 314 and the third hole 315. The shielding layer 32 has a plurality of fourth holes 323 and a plurality of fifth holes 324 corresponding to the first holes 313 and the second holes 314 of the top insulative board 31 in a vertical direction respectively, the diameter of the fourth hole 323 is larger than the diameter of the fifth hole 324. The bottom insulative board 33 has a plurality of seventh holes 333 and a plurality of eighth holes 334 corresponding to the first holes 313 and the second holes 314 of the top insulative board 31 in a vertical direction respectively, the diameter of the seventh hole 333 is larger than the diameter of the eighth hole 334.

The adaptor 3 further comprises a first via 303, second via 305 and a third via 304. The first via 303 received in the first hole 313, the fourth hole 323 and the seventh hole 333, the third via 304 received in the second hole 314, the fifth hole 324 and the eighth hole 334. The second via 305 passes through the top insulative board 31 and the shielding layer 32, the second via 305 is integrated with the shielding layer 32 and the bottom insulative board 31 does not define a hole corresponding to the position of the third hole 315 in vertical direction, so the second via 305 is not passed through the bottom insulative board 33. The diameter of the first hole 313 is equal to the diameter of the fourth hole 323 and the diameter of the fourth hole 323 is equal to the diameter of the seventh hole 333. The diameter of the second hole 314 is equal to the diameter of the fifth hole 324 and the diameter of the fifth hole 324 is equal to the eighth hole 334.

Figure 6:
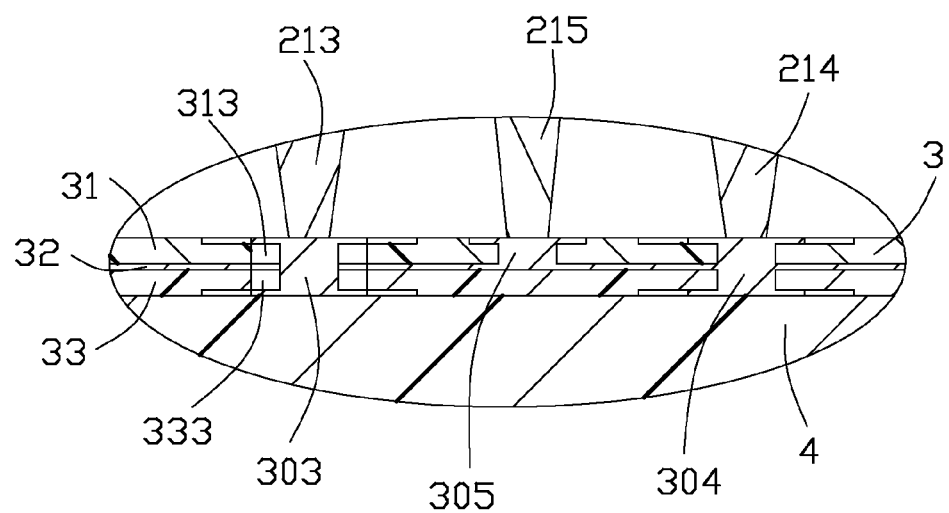
FIG. 6 is an enlarged view of the circular portion shown in FIG. 5.

Referring to FIGS. 5-6, after assembling the electrical connector assembly 100, the terminals 21 electrically connect the top pads of the chip module 1 and the shielding terminals 215 electrically connect the shielding elements of the chip module 1. The terminals 21 and the shielding terminals 215 electrically connect the adaptor 3, thus, the contacting terminal 213 contacts the first via 303, the grounding terminals 214 contacts the third via 304 and the shielding terminals 215 contacts the second via 305. The terminals 21 electrically connect the printed circuit board 4. The contacting terminal 213 is touching the bottom pad of the printed circuit board 4 by the first via 303 and the contacting terminal 213 is not touched the shielding layer 32. There is a gap between the first via 303 and the fourth hole 323. The grounding terminals 214 is contacted the shielding layer 32 and the grounding layer of the printed circuit board 4 by the third via 304. The shielding terminal 215 is electrically connected the shielding layer 32 by the second via 305. In a word, the contacting terminal 213 only touches the bottom pad of the printed circuit board 4 and is not contacted to the shielding layer 32, the grounding terminal 214 electrically connect the shielding layer 32 and the grounding layer of the printed circuit board 4, the shielding terminal 215 only touches the shielding layer 32 and is contacted the printed circuit board 4.

The interval between the adjacent first via 303 and third via 304 is equal to the interval between the adjacent bottom pads of the printed circuit board 4, the interval between the adjacent first via 303 and second via 305 is equal to the interval between the adjacent contacting terminal 213 and grounding terminal 215, the interval between the adjacent third via 304 and second via 305 is equal to the interval between the adjacent shielding terminal 214 and shielding terminal 215. So, it can electrically connect the electrical connector 2 and the printed circuit board 4 without changing the interval of the bottom pads of the printed circuit board 4, and it can get better shielding effect, so as to form a whole shielding net, and it can switch the interval between the electrical connector 2 and printed circuit board 4 that have different interval.

The adaptor 3 is located below the electrical connector 2 and electrically connecting the terminals 21 and the shielding terminals 215, the adaptor 3 is located on the printed circuit board 4 and electrically connecting the printed circuit board 4, the shielding terminals 215 electrically connect from the bottom 10 of the chip module 1 to the shielding layer 32 and it can get better shielding effect.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly for mounting on a printed circuit board, comprising:
   a printed circuit board;
   an electrical connector assembled on the printed circuit board and comprising an insulative housing and a plurality of terminals and a shielding element received therein; and
   an interposer assembled between the electrical connector and the printed circuit board, and electrically connecting the terminals and the shielding element of the electrical connected to the printed circuit board;
   wherein said interposer comprises a shielding layer electrically connected the shielding element;
   wherein the terminals comprise grounding terminals and contacting terminals, the grounding terminals electrically connected the shielding layer of the interposer and a grounding layer of the printed circuit board, and the contacting terminals electrically connected bottom pads of the printed circuit board and not electrically connected the shielding layer of the interposer; and
   wherein said interposer further comprises a plurality of first vias electrically connected the contacting terminals and the bottom pads of the printed circuit board, a plurality of second vias electrically connected the shielding element and the shielding layer of the interposer, and a plurality of third vias electrically connected the grounding terminals, the shielding layer of the interposer and the grounding layer of the printed circuit board.

2. The electrical connector assembly as claimed in claim 1, wherein said interposer further comprises a top insulative board and a bottom insulative board and the shielding layer located between the top insulative board and the bottom insulative board.

3. The electrical connector assembly as claimed in claim 1, wherein the interval between the adjacent first via and third via is equal to the interval between the adjacent pads of the printed circuit board.

4. The electrical connector assembly as claimed in claim 1, wherein said terminals are arranged in a matrix and surrounded by the shielding element.

5. The electrical connector assembly as claimed in claim 4, wherein said electrical connector assembly further comprises a chip module assembled on the electrical connector.

6. An electrical connector assembly comprising:
   an electrical connector including an insulative housing equipped with a plurality of signal terminals, a plurality of grounding terminals and a plurality of shielding terminals intermixed with one another in a matrix manner;
   an adaptor located below the electrical connector and defining a plurality of first vias, a plurality of second vias and a plurality of third vias intermixed with one another in said matrix manner to correspond to and aligned with the corresponding signal, grounding and shielding terminals, respectively, said adaptor further defining a middle metallic shielding layer sandwiched between two opposite top and bottom insulative layers in a vertical direction to receive said first, second and third vias; wherein
   each of the first vias extends through all the top insulative layer, the middle shielding layer and the bottom insulative layer while not contacting the middle shielding layer, each of the second vias extends through all the top insulative layer, the middle shielding layer and the bottom insulative layer and contacting the middle shielding layer, and each of the third vias extends through the top insulative layer and into the middle shielding layer, not including the bottom insulative layer and contacting the middle shielding layer; and a printed circuit board located under the adaptor;

wherein said printed circuit board defines a layout corresponding to the first vias and the second vias while without the third vias;

wherein each of the top insualtive layer and the bottom insulative layer is essentially of a board configuration much thicker than the middle shielding layer; and wherein each of said top insulative layer, the middle shielding layer and the bottom insulative layer defines a plurality of through holes receiving the corresponding vias.

7. The electrical connector assembly as claimed in claim 6, wherein each of said third vias is located between either two adjacent first vias or between one adjacent first via and one adjacent second via in either a row direction or a column direction on which said matrix manner is based.

8. The electrical connector assembly as claimed in claim 6, wherein the shielding terminal is diametrically smaller than both said signal terminal and said grounding terminal while sharing a same length.

9. The electrical connector assembly as claimed in claim 6, further including a chip module defining conductors corresponding to the signal terminals, the grounding terminals and the shielding terminals.

* * * * *